United States Patent
Gruen et al.

(10) Patent No.: US 6,811,612 B2
(45) Date of Patent: Nov. 2, 2004

(54) PATTERNING OF NANOCRYSTALLINE DIAMOND FILMS FOR DIAMOND MICROSTRUCTURES USEFUL IN MEMS AND OTHER DEVICES

(75) Inventors: Dieter M. Gruen, Downers Grove, IL (US); Hans-Gerd Busmann, Bremen (DE); Eva-Maria Meyer, Bremen (DE); Orlando Auciello, Bolingbrook, IL (US); Alan R. Krauss, deceased, late of Naperville, IL (US); by Julie R. Krauss, legal representative, Naperville, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/169,879

(22) PCT Filed: Jan. 26, 2001

(86) PCT No.: PCT/US01/02755
§ 371 (c)(1),
(2), (4) Date: Nov. 8, 2002

(87) PCT Pub. No.: WO01/57295
PCT Pub. Date: Aug. 9, 2001

(65) Prior Publication Data
US 2004/0129202 A1 Jul. 8, 2004

Related U.S. Application Data

(60) Provisional application No. 60/178,424, filed on Jan. 27, 2000.

(51) Int. Cl.$^7$ .......................... C30B 23/04; C30B 29/04
(52) U.S. Cl. .......................... 117/94; 117/95; 117/101; 117/104; 117/929; 423/446; 423/445 B
(58) Field of Search .......................... 117/94, 95, 101, 117/104, 929; 423/446, 445 B

(56) References Cited

U.S. PATENT DOCUMENTS

| | | | | |
|---|---|---|---|---|
| 5,772,760 A | * | 6/1998 | Gruen et al. | ................. 117/104 |
| 5,849,079 A | * | 12/1998 | Gruen et al. | ................. 117/104 |
| 5,989,511 A | * | 11/1999 | Gruen et al. | ................. 423/446 |

* cited by examiner

*Primary Examiner*—Robert Kunemund
(74) *Attorney, Agent, or Firm*—Emrich and Dithmar

(57) ABSTRACT

MEMS structure and a method of fabricating them from ultrananocrystalline diamond films having average grain sizes of less than about 10 nm and feature resolution of less than about one micron. The MEMS structures are made by contacting carbon dimer species with an oxide substrate forming a carbide layer on the surface onto which ultrananocrystalline diamond having average grain sizes of less than about 10 nm is deposited. Thereafter, microfabrication process are used to form a structure of predetermined shape having a feature resolution of less than about one micron.

15 Claims, 13 Drawing Sheets

PATTERNING OF NANOCRYSTALLINE DIAMOND FILMS FOR DIAMOND MICROSTRUCTURES USEFUL IN MEMS AND OTHER DEVICES

This application is a 371 of PCT/US 01/02755 filed Jan. 26, 2001 and claims the benefit of provisional application No. 60/178424, filed Jan. 27, 2000.

CONTRACTUAL ORIGIN OF THE INVENTION

The United States Government has rights in this invention pursuant to Contract No. W-31-109-ENG-38 between the U.S. Department of Energy (DOE) and The University of Chicago representing Argonne National Laboratory.

FIELD OF THE INVENTION

The present invention relates to microelectromechanical systems (MEMS) technologies.

BACKGROUND OF THE INVENTION

A considerable amount of development has taken place recently in the use of diamond for MEMS devices. For instance, "Diamond MEMO-A New Emerging Technology" by E. Kohn et al., Diamond and Related Materials 8 (1999) 934940, discusses the use of diamond and for electromechanical devices and their integration with driver or signal conditioning circuits. The article discloses chemical vapor deposition (CVD) films on large area substrates and also discloses the use of nanocrystalline, randomly oriented films when CVD diamond films ha been deposited on insulating substrates like silicon dioxide. However, there has to be substantial pretreatment of the silicon dioxide in order to deposit diamond films. Accordingly, the use of diamond films on silicon dioxide and silicon substrates has not enjoyed the wide spread use envisioned.

Another article relating to the general subject matter appeared in Thin solid films. by Raleshuni Reanesham entitled "Fabrication of Diamond Microstuctures For Micoetromechanol Systems (MEMS) by a Surface Micmachining Process", Thin Solid Films 340(1999) 1–6. In this article, various methods of depositing polycrystalline diamond films on silicon dioxide/silicon substrates are reported including a variety of pretreatment methods including ultrasonically damaging the surface or etching the surface, prior to film deposition. The article describes methods in which the silicon dioxide surface on which the diamond was to be deposited was pretreated including damaging the surface by ultrasonic agitation either for the entire surface or patterned portions of the surface. These methods have heretofore been required in order to deposit diamond on silicon and silicon dioxide surfaces.

Another aspect of the problem encountered in the use of diamond films for MEMS devices is reported in the article "High Nucleation Density For Growth of Smooth Diamond Films" by Yang et al. in the Applied Phys. Letter Vol. 66, No. 316January 1995, pgs. 311–313. These papers generally show the state of the art of applying diamond films to MEMS devices, which require substantial pretreatment of the silicon or silicon dioxide substrate prior to depositing diamond film thereon.

OBJECTS OF THE INVENTION

Accordingly, it is an object of the present invention is to provide a superior diamond film for use in MEMS devices and to the formation of ultrananocrystalline diamond films on silicon dioxide and other oxide substrates and for the patterning of these films for producing MEMS devices.

Another object of the present invention is to provide a method of depositing ultrananocrystalline films of the type disclosed in U.S. Pat. No. 5,989,511 issued to Gruen et al. Nov. 23, 1999, the entire disclosure of which is incorporated herein by reference as well as films prepared according to the teachings of U.S. Pat. No. 5,620,512 issued to Gruen et al. Apr. 15, 1997, and U.S. Pat. No. 5,772,560 issued to Gruen et al. Jun. 30, 1998, the entire disclosures of each of the above named patents being incorporated herein by reference.

The ultrananocrystalline films taught in the above-identified patents can be directly deposited on oxide substrates without pretreatment thereof and an object of this invention is to provide a method for depositing ultrananocrystalline films directly on oxide substrates without the necessity of pretreating the oxide substrates.

Another object of the present invention is to provide a method of fabricating structures in which a carbon dimer species is contacted directly with an oxide substrate forming a carbide layer on the surface onto which ultrananocrystalline diamond having average grain sizes of less than 10 nanometers is deposited permitting feature resolution of less than about 1 micron using known microfabrication processes.

Another object of the present invention is to provide a microelectromechanical (MEMS) structure formed at least in part from ultrananocrystalline diamond films having average grain sizes of less than about 10 nanometers and feature resolution of less than about 1 micron.

Another object of the present invention is to provide a method of fabricating free standing nanocrystalline MEMS structures having feature resolution of 1 micron or less which a hard mask material is deposited over the diamond film and a pattern is formed over the hard mask material followed by etching the exposed hard mask to expose selected areas of the diamond film and thereafter removal of the exposed diamond film to form the diamond pattern.

Another object of the present invention is to provide a method which includes removal of the substrate and remaining hard mask material to produce free standing structures of ultrananocrystalline diamond film useful in MEMS devices.

SUMMARY OF THE INVENTION

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
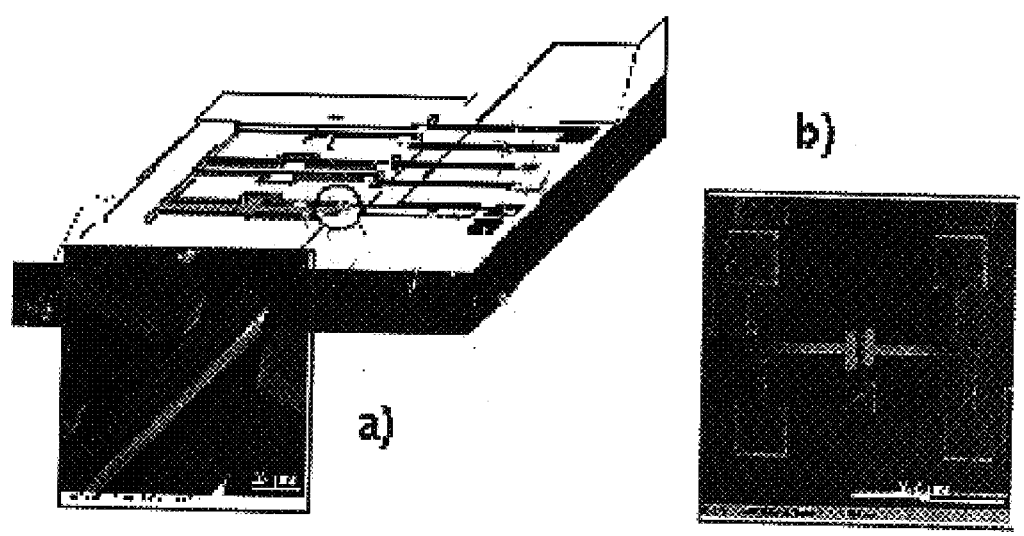
FIG. 1A shows a cantilever beam structure for determining Young's modulus in a vibration measuring equipment.
FIG. 1B shows a thin film stress indicator.

The mechanical, thermal, chemical and tribological properties of diamond make it an ideal material for the fabrication of MEMS components. Cost effective fabrication of these components involves coating silicon or silicon oxide or other oxides with diamond films. However, conventional CVD diamond deposition methods result in either a coarse-grain pure diamond structure that prevents high resolution patterning, o in a fine-diamond film with a significant amount of intergranular non-diamond carbon.

This invention entails the use of phase-pure ultrananocrystalline diamond (NCD) films for the fabrication of MEMS components. NCD films are grown by microwave plasma CVD using C60-AR or $CH_4$-AR plasmas, as described in the above-identified Gruen et al. patents, resulting in films that have 3–5 nanometer grain size, are 10–20 times smoother than conventionally grown diamond films and can have brittle fracture strength similar to that of single crystal diamond. The inventors have used lithographic patterning, lift-off and etching techniques to fabricate a two dimensional cantilever NCD-MEMS strain gauge with strength resolution of about 100 nanometers.

Three dimensional structures have been made by conformal coating of substrates with NCD films, as taught in the aforementioned Gruen et al. patents followed by selective etching of the core material, for instance selectively etching silicon with hydrogen fluoride. The stability of free standing structures can be attributed to extremely low stress NCD films due to very small grain size.

The inventors have made the first practical diamond components for microelectromechanical systems (MEMS). In the expanding market for MEMS, many potential applications for these microscopic devices are not, in fact, practical because the properties of the material currently used—silicon—are not suitable. This limitation is especially true for any kind of rapidly rotating device, such as a tiny engine for a satellite, because silicon wears too quickly. The exceptional physical properties of diamond (hardness, wear resistance, thermal and chemical stability) expands the range of applications for microdevices. Diamond components have been made in the laboratory by other methods, but the inventive method is the first to produce components with the smoothness, detail, and structural stability necessary for practical use.

MEMS is a manufacturing strategy that integrates miniature mechanical devices and semiconductor microcircuitry on a silicon chip. The result is a chip that not only thinks, but also senses and acts. Like the integrated circuit before it, MEMS is a so-called "enabling" technology. That is it opens whole new classes of ideas and applications. And, like the integrated circuit, its impact on business and society could be unimaginably vast. The inventors' diamond films "enable the enable."

"Ultrananocrystalline" diamond films are deposited by a chemical vapor deposition (CVD) method described in the above-identified Gruen et al. patents and patterned by using photolithography and other techniques common in the semiconductor industry. The result is freestanding diamond structures as little as 300 nanometers (nm) thick with feature resolution as small as 100 nm and friction coefficients as low as 0.01. Diamond components may be as much as 10,000 times more wear-resistant than those made from silicon.

The Gruen et al. CVD method was developed using fullerenes, which are spherical molecules of pure carbon containing 60 carbon atoms. Fullerene powder is vaporized and introduced into an argon plasma, causing the spheres to fragment into two-atom carbon molecules (dimers). Subsequent work showed that the same result can be achieved by introducing methane ($CH_4$) into an argon plasma as long as little or no additional hydrogen is present, that is less than about 1%. The plasma forms a ball over a wafer of silicon or other material that has been "primed" with fine diamond powder. As the carbon dimers settle out of the plasma onto the wafer, they arrange themselves into a film of small diamond crystals about 3 to 5 nm in diameter, or about ½oth the size of a bacterium. These crystals have exactly the same crystalline structure as the diamond in a ring.

This method differs in two respects from other CVD methods for making diamond films: (1) the molecular building block is different (carbon dimers rather than methyl radicals) and (2) little or no hydrogen is present in the plasma (~1%), while in other methods the plasma contains 97.99.5% hydrogen along with methane.

The ultrananocrystalline films produced by the Gruen et al. method are extremely pure, have crystals about 50 to 200 times smaller than those in other films and are 10 to 20 times smoother than conventional high-purity CVD diamond films. The inventors use different methods to produce MEMS structures.

(1) Precision growth. A "starter" (nucleation) layer of nanocrystalline diamond powder is applied on a silicon substrate. As in semiconductor fabrication, a patterned mask is applied, and in the exposed areas the starter layer is etched away. The mask material is removed, and the film-growth process begins. The film forms only in the areas where the nucleation layer remains.

(2) Flat, freestanding structures. The ultrananocrystalline diamond films can also be grown on oxides, such as $Al_2O_3$, $ZrO_2$, $TiO_2$, silica glass or silicon dioxide. A silicon substrate is treated in any well-known manner so that it forms a silicon dioxide surface layer, on which the diamond film is grown. Next, the diamond layer is detached from the substrate by etching away the silicon dioxide, for instance with HF gas. This method is useful for making gears, for example, for use in a motor or other devices or structures with moving parts.

The original motivation for the invention was the need for more durable components for the class of MEMS called moving mechanical assemblies (MMAs), for example, tiny pumps, motors, and turbines. Many of the visionary applications of MEMS, such as tiny water satellites and deep space craft, require MMAs that can operate for years or decades. Because of their size, such devices must rotate at speeds as high as 800,000 RPM to do useful work. At such high speeds, silicon components wear out in minutes. Diamond is hard enough to withstand this wear. Also, because atomic forces begin to dominate at this scale, such devices must operate without external lubricants. Diamond films acquire a surface (adsorbed) layer of hydrogen or oxygen, and if the film is smooth enough, this layer serves as lubrication. Films produced by other methods than the Gruen et al. patents described are so rough that the surface irregularities negate the effect of the adsorbed layer. Furthermore, such a film would quickly abrade any nondiamond component in contact with it.

Today's commercial devices are all based on silicon, and the physical limitations of silicon have been the limitations on the MEMS revolution. With components made of diamond—harder than anything else on earth and practically impervious to heat and chemical attack—those limitations vanish.

Some diamond-film-on silicon devices have been made in the laboratory by other methods. Examples include gas flow and chemical sensors, piezoelectric pressure sensors, and thermal actuators. However, these films are both very difficult to fabricate and too coarse to make the truly tiny devices envisioned for the next generation of MEMS. The inventive method is the first to produce diamond with the properties needed if MEMS technology is to take the next leap forward.

Many of these properties stem from the small crystal size in the ultrananocrystalline film, which is, crystal size and associated properties make it possible to produce high-precision, freestanding structures at relatively low temperatures.

Because of the small crystal size, the inventors have achieved patterning with a resolution of 100 nm (0.1 $\mu$m), which is 10 to 20 times better than achieved with other diamond film methods (resolution 1–3 $\mu$m). Thus, the achievable tolerance of components is limited by the resolution of the lithographic patterning, rather than by the material. This makes it possible to create precision fits and much smaller feature resolution, such as gears with teeth the size of a bacterium.

These properties also mean the film can be grown on silicon dioxide, which can later be removed, whereas other films can be grown only on silicon. Thus, this method is uniquely capable of producing "detachable" structures.

Because hydrogen is not required, the difference in the chemistry (a much lower activation energy for film growth) makes it possible to grow ultrananocrystalline diamond films at temperatures as low as 350° C, compared with a typical value of 800–1000° C for industrial CVD diamond-film processes. This low temperature makes it possible to integrate diamond films in devices containing materials with relatively low melting points, such as glass. Lithographic methods that can selectively etch diamond, silicon, or silicon dioxide makes it possible to fabricate multilayer MEMS structures using fewer masking and alignment operations.

Other important properties arising from the small crystal size include extreme smoothness, low residual stress, and the ability to form a uniform coating on very small structures. The friction coefficient of the ultrananocrystalline films is 0.01 to 0.04 roughly the same as Teflon™. The low residual stress means that, unlike other diamond films, the freestanding diamond structures made by the present invention show little warping.

The invention relates to manufacturing and patterning of carbon and diamond thin films and the determination of diamond material properties as for example the Young's modulus. Patterns can be generated by selective nucleation and growth of diamond thin films or by usage of a suitable mask and etching of diamond in oxygen plasma. Referring to the drawings, examples of patterns for the characterization of thin films are shown in FIG. 1. FIG. 1A shows a cantilever beam structure with which the Young's modulus can be determined in vibration measuring equipment by detection of the resonance frequency, while FIG. 1B shows a thin film indicator structure, which due to lever action on the free standing cantilever, the film stress is displayed at the vernier scale.

Figure 2:
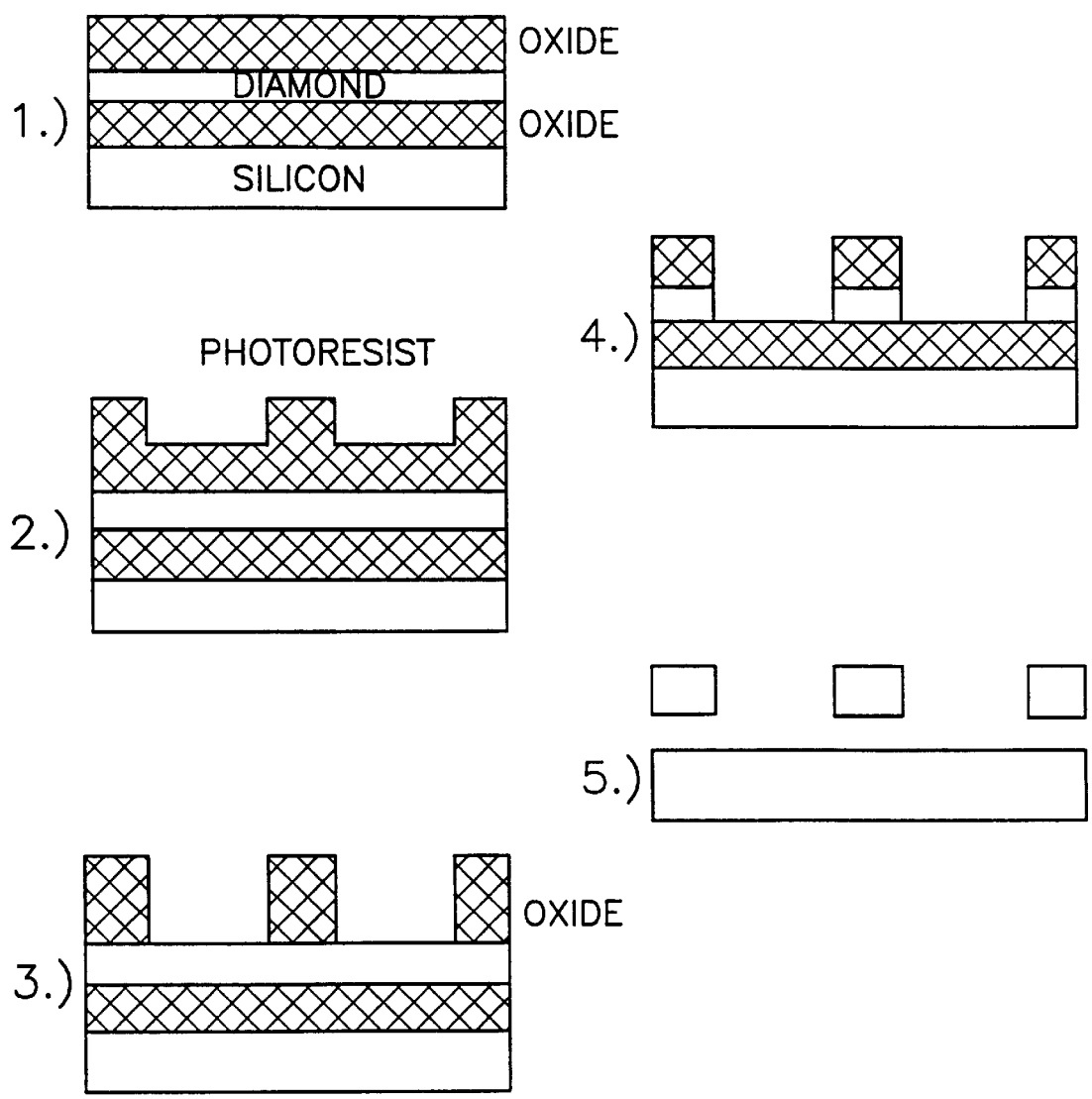
FIG. 2 illustrates a process flow diagram for the fabrication of cantilever structures by etching diamond in oxygen plasma.
Figure 3:
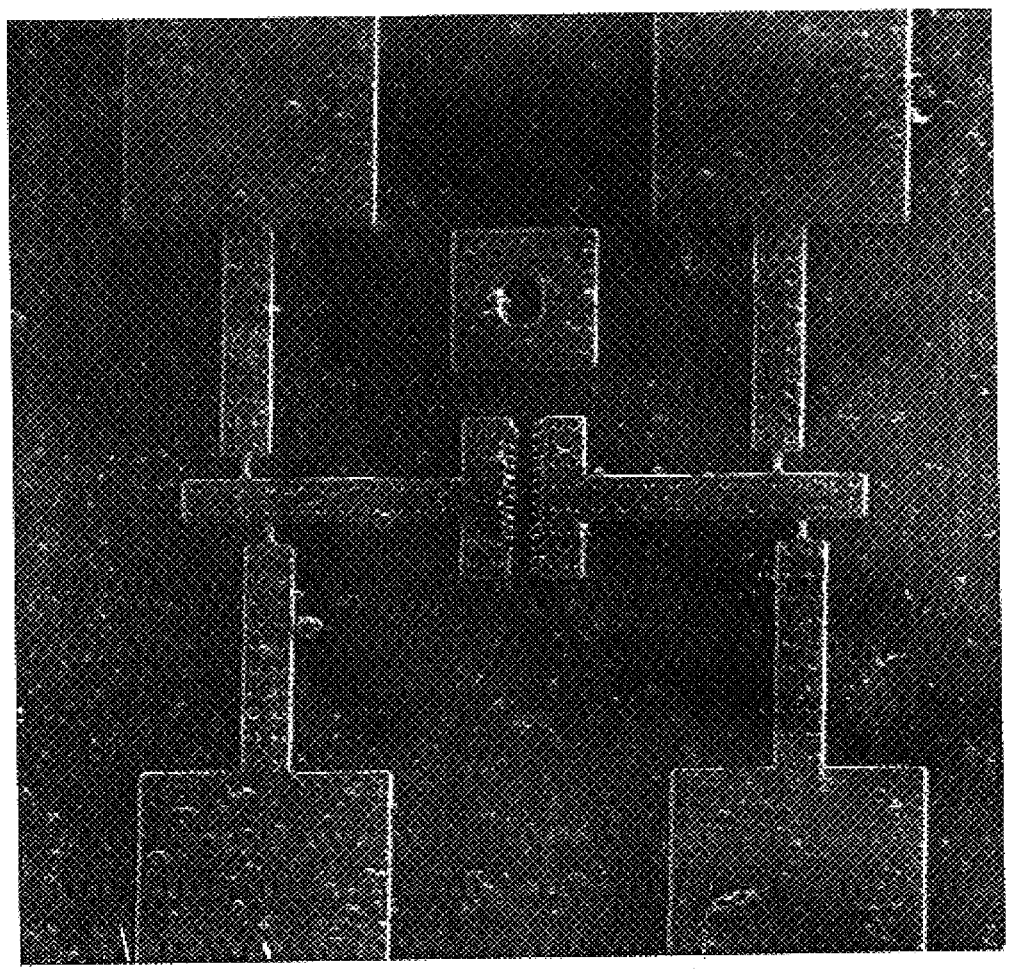
FIG. 3 is a SEM-micrograph of a stress indicator structure etched in diamond still with the oxide hard mask on top. The acceleration voltage of the electrons during microscopy was 15 kV. It is a top view of the sample with a tilt angle of 25°.
Figure 4:
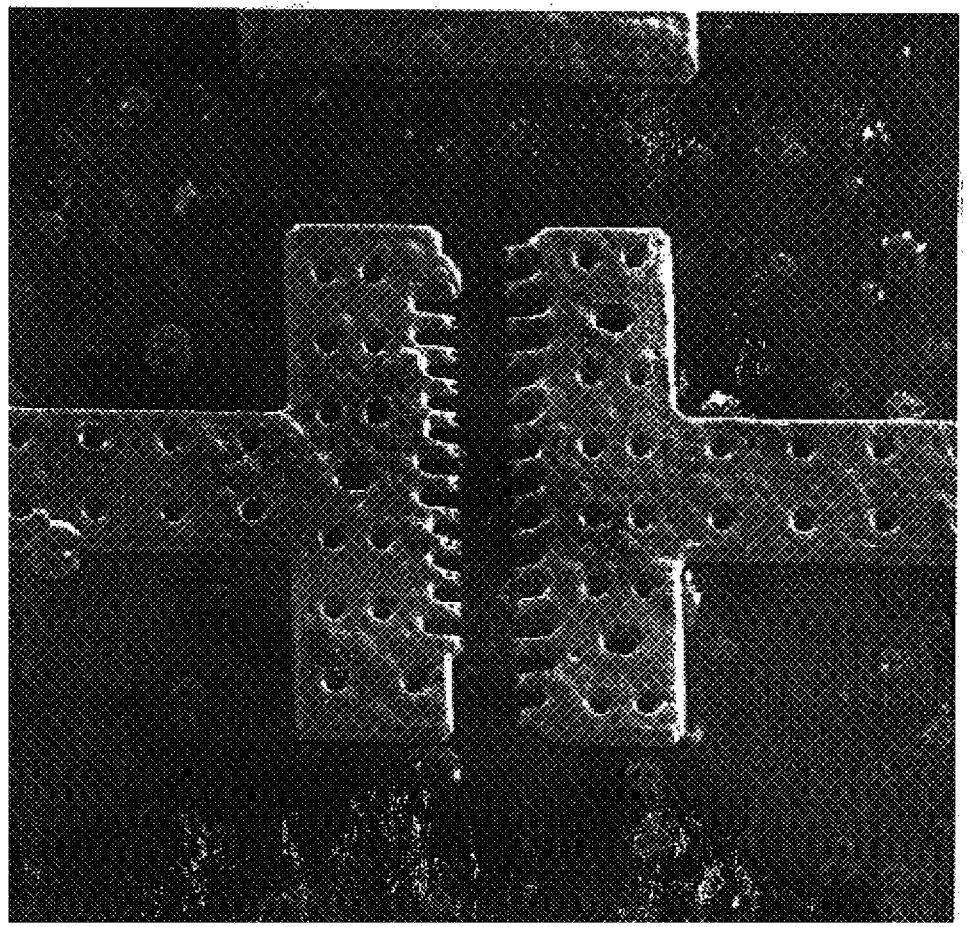
FIG. 4 is a SEM-micrograph of a stress indicator structure etched in diamond, magnification out of FIG. 3.
Figure 5:
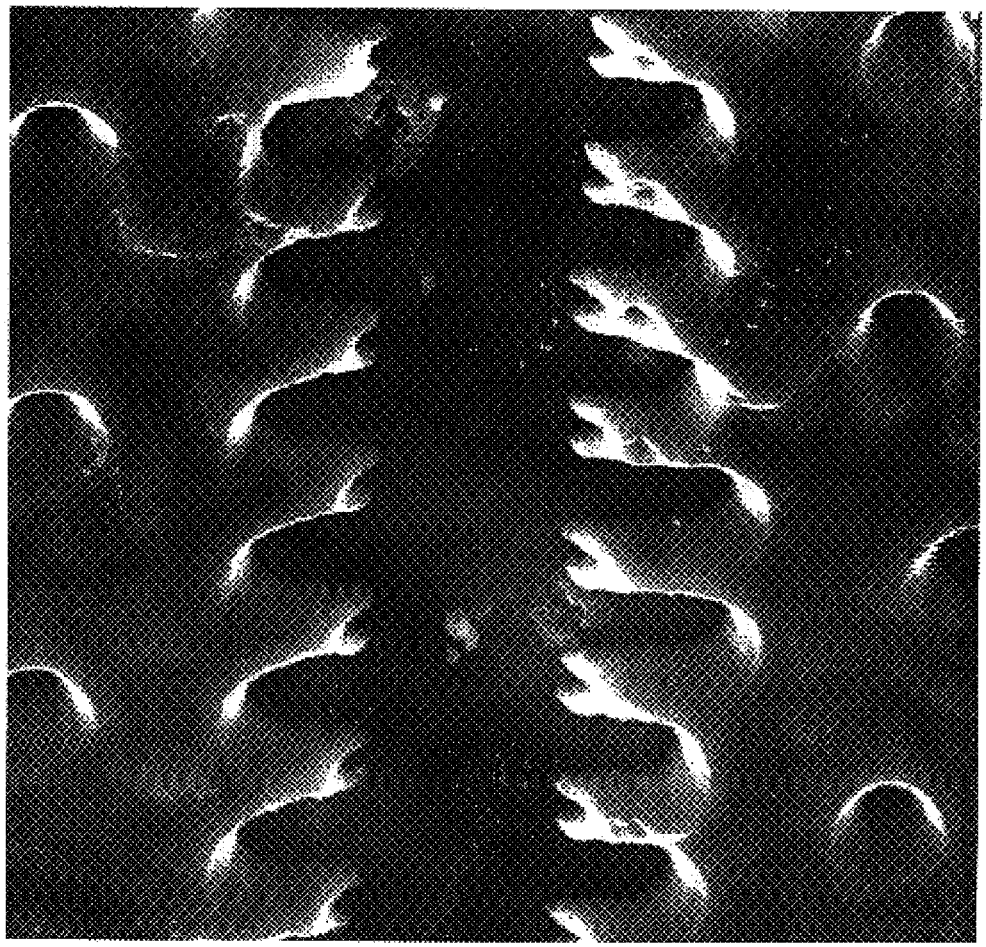
FIG. 5 is a SEM-micrograph of the vernier scale of a stress indicator structure, magnification out of FIG. 4.
Figure 6:
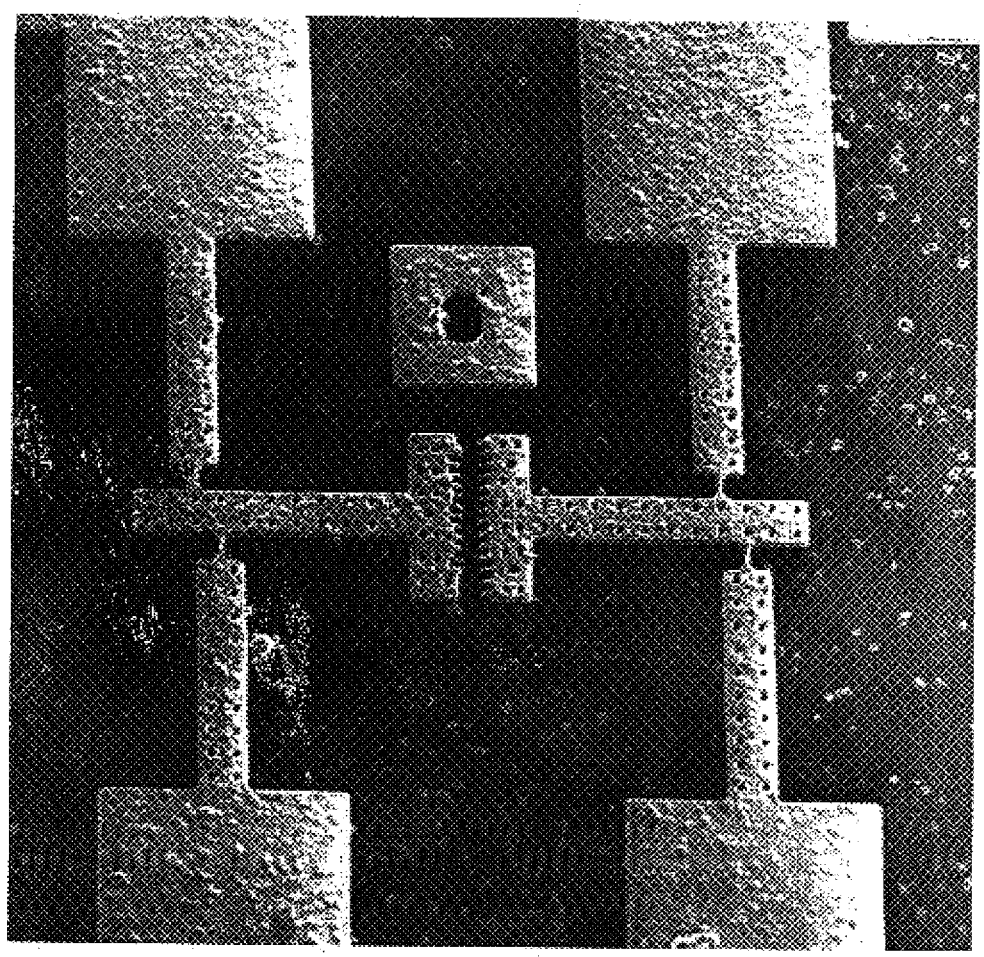
FIG. 6 is a SEM-micrograph of a stress indicator, the tilt angle of the sample was 55°.
Figure 7:
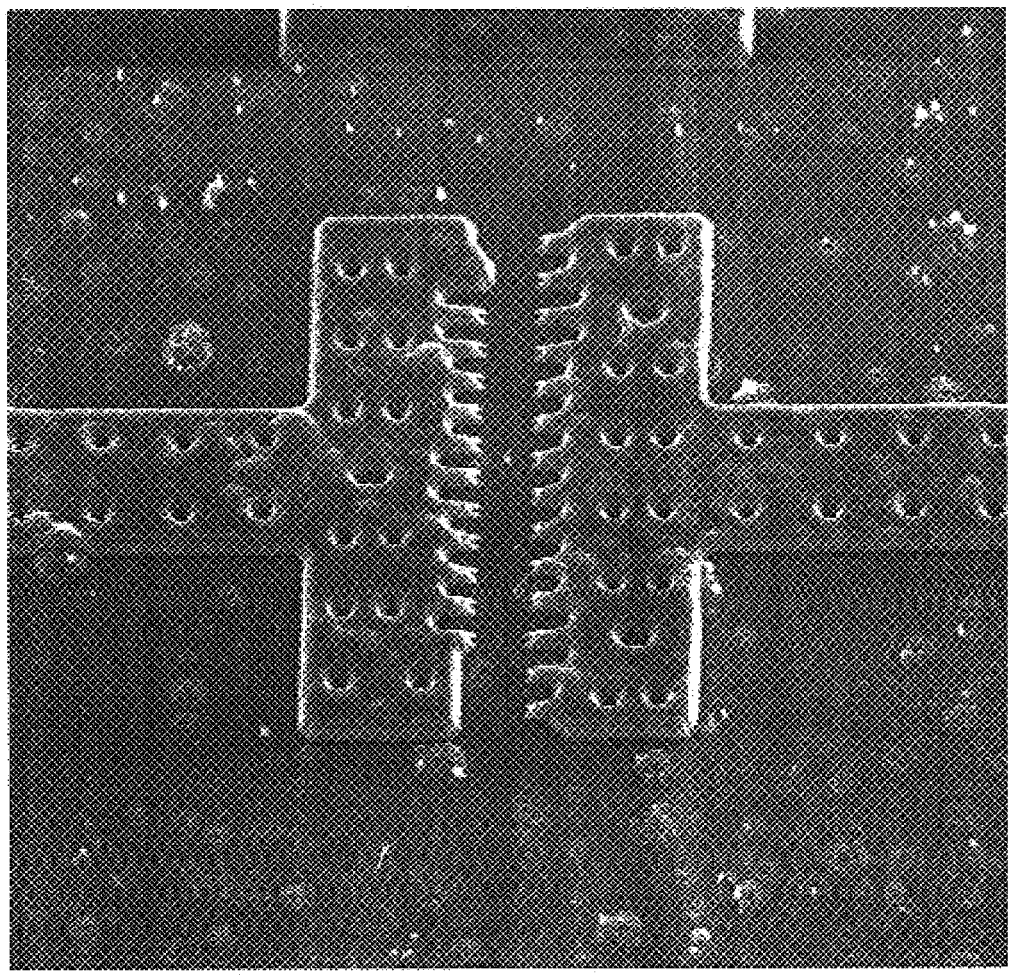
FIG. 7 is a SEM-micrograph of a stress indicator structure etched in diamond, magnification out of FIG. 6.
Figure 8:
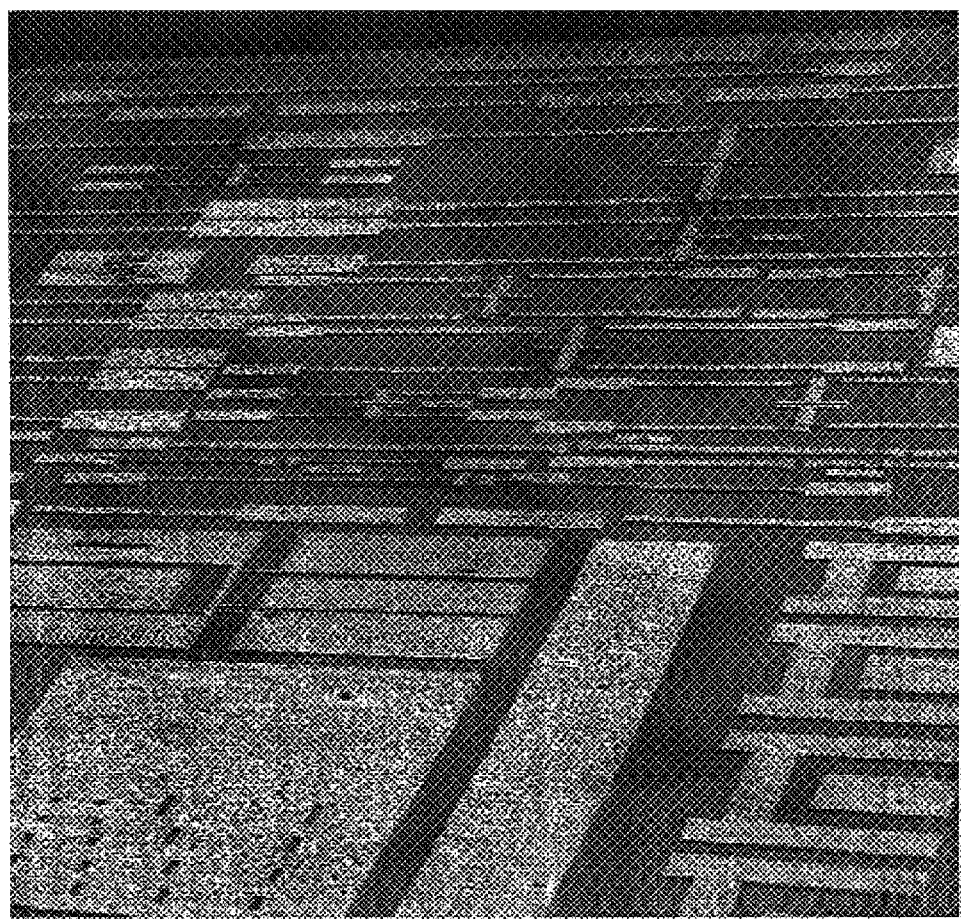
FIG. 8 is a SEM-micrograph of a stress indicator structure etched in diamond. The tilt angle of the sample was 80°.
Figure 9:
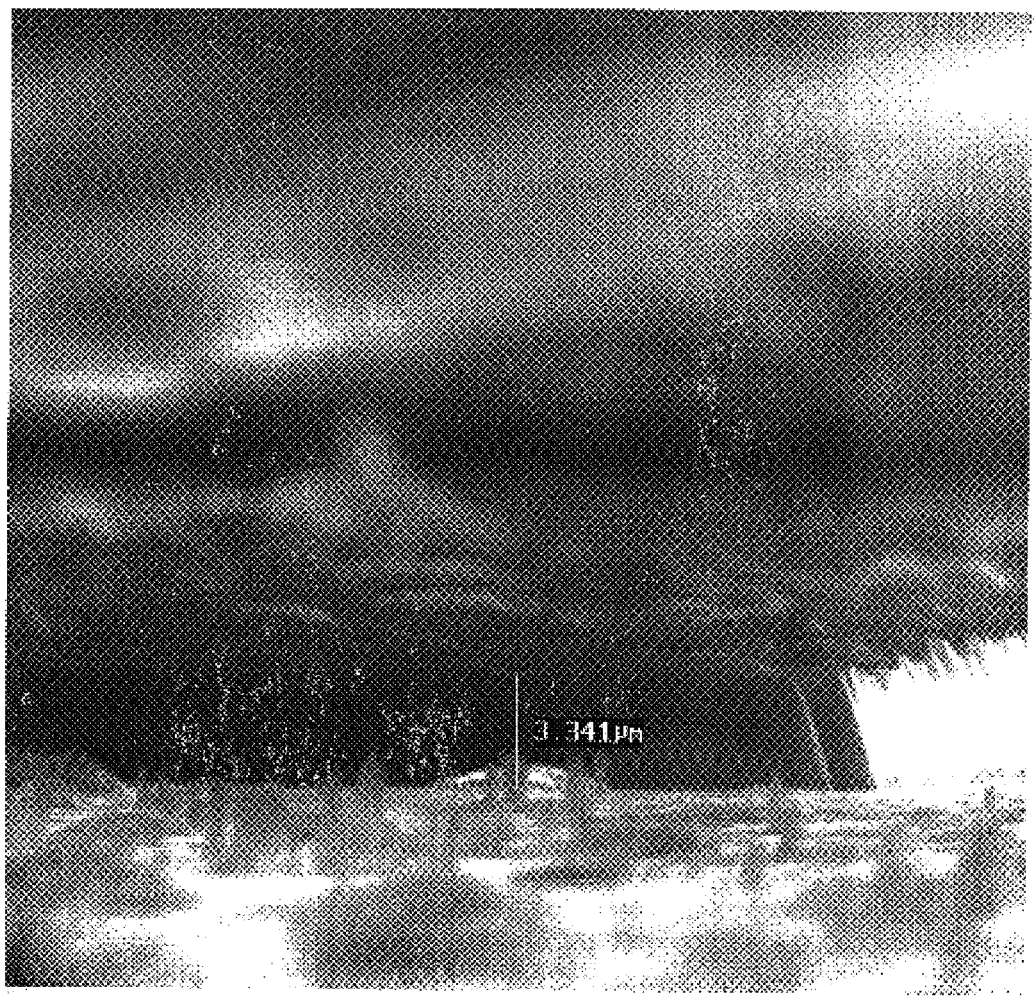
FIG. 9 is a SEM-micrograph of a stress indicator structure. The tilt angle of the sample was 85°.
Figure 10:
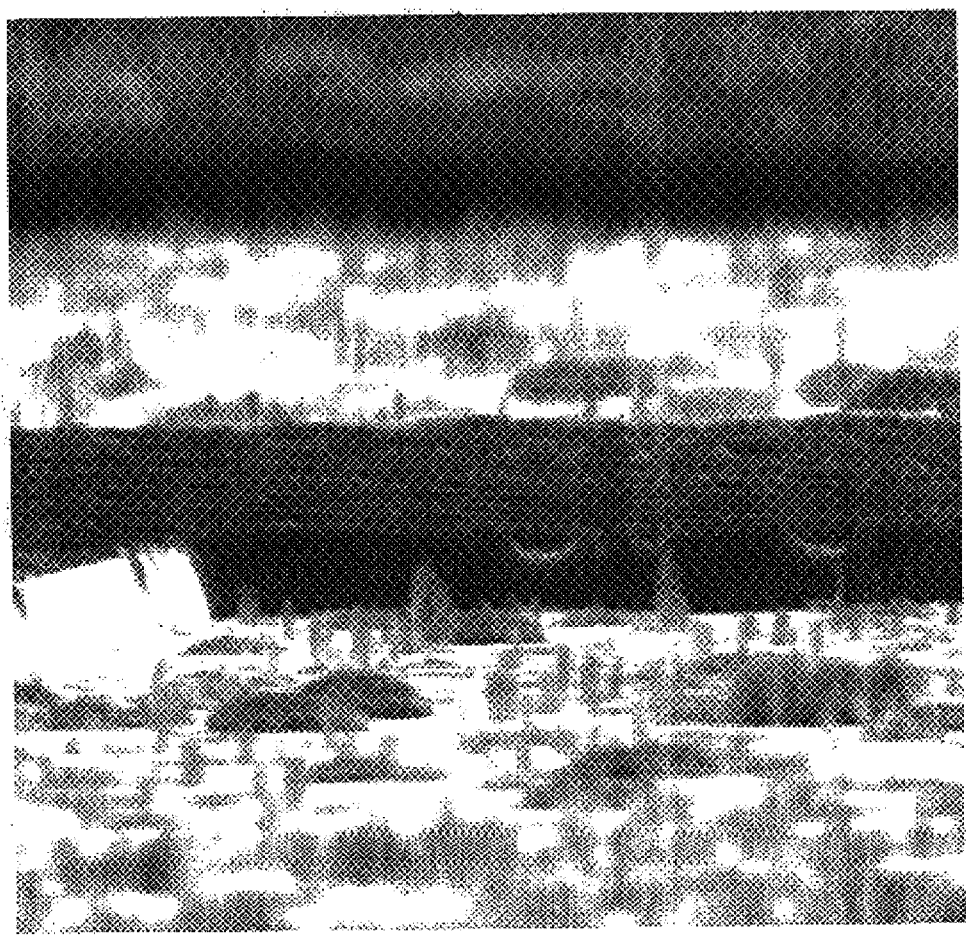
FIG. 10 is a SEM-micrograph of a stress indicator. The tilt angle of the sample was 85°.

Prior to etching the diamond was coated with a 1 $\mu$m thick Plasma Enhanced Carbon Vapor Deposition (PECVD) oxide layer (step 1 in FIG. 2). This oxide hard mask was patterned using photolithography and dry etching (steps 2 and 3 in FIG. 2). The parameters for the structuring of the oxide hard mask were (step 3, FIG.):

$CF_4$-flow$_{\phi CF4}$=sccm, $CHF_3$-flow$_{\phi CHF3}$=8 sccm, coil-power $P_C$=800 W, platen-power $P_{pl}$=70 W, chamber-pressure p=3 mtorr, The parameters for the diamond thin film were (step 4 in FIG. 2):

Argon-flow$_{\phi AR}$=30 sccm, oxygen-flow$_{\phi O2}$=30 sccm, coil-power $P_c$=800 W, platen-power $P_{pl}$=200 W.

chamber-pressure p 5 mtorr, etching time t=19 min of the approximately d=2 $\mu$m thin film.

The SEM-micrographs of FIGS. 3–12 show successfully realized indicator structures prior to removal of the oxide mask and the sacrificial layer (fabrication step 5 in FIG. 2). The tilt angles of the sample during microscoping vary from 25° to 85° (FIG. 3–FIG. 10).

Polycrystalline diamond on wafer substrates had oxide and silicon underground patterns on which the diamond was deposited with different nucleation densities. The topography of sample 980716A shown in FIG. 11 leads to the conclusion that the nucleation density might have been low due to the oxide sacrificial layer as diamond nucleation underground.

Figure 11:
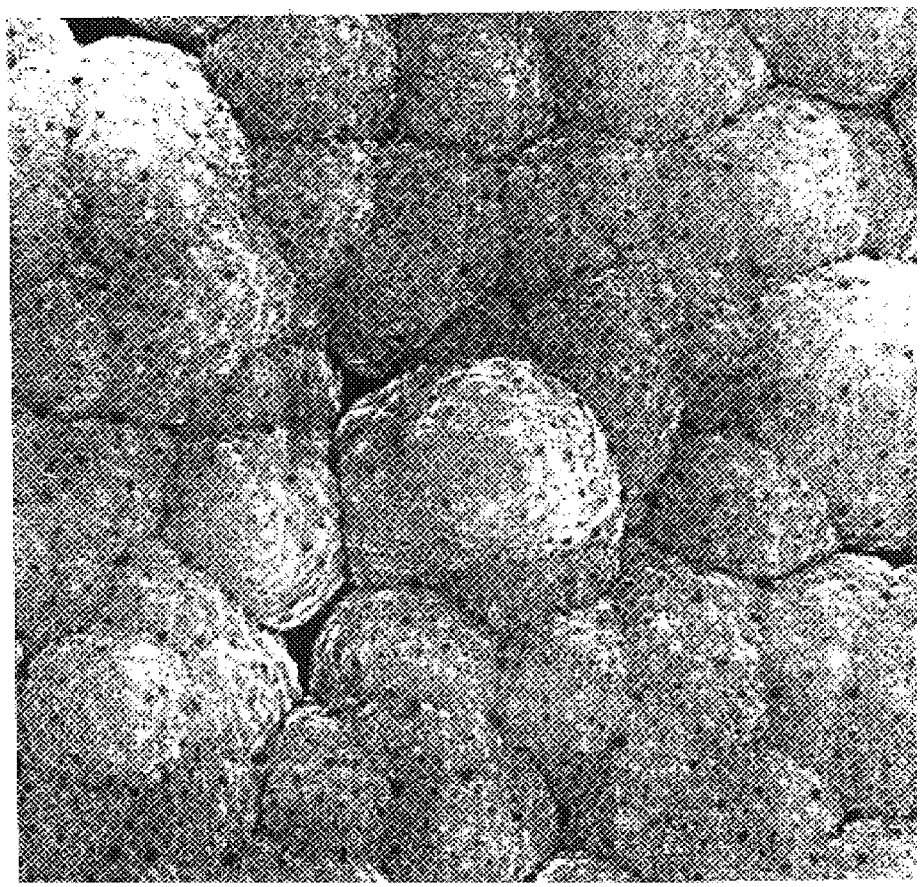
FIG. 11 is a SEM-micrograph of the topography of sample 980716A after diamond-patterning and removal of the oxide hard mask in wet HF.
Figure 12:
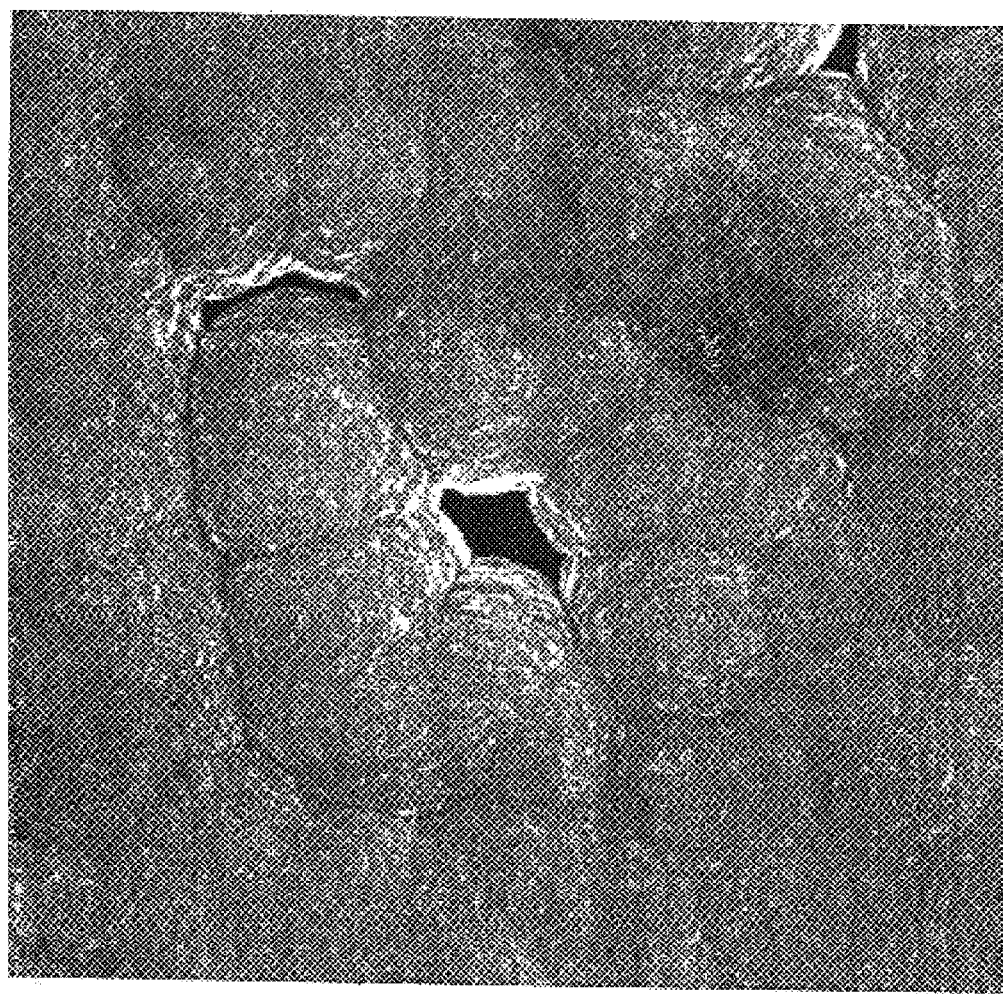
FIG. 12 is a SEM-micrograph of the topography of sample 980716B after removal of the oxide hard mask in wet HF.

But another explanation for the surface roughness of the nanocrystalline diamond in. FIG. 11 may be that the diamond has been slightly etched when the 5 $\mu$m oxide hard mask had been removed in HF wet etch. The same has been done to sample 980716B shown in FIG. 12. The formerly deposited 5 $\mu$m oxide hard mask has been removed from this sample in HP wet etch (then the micrograph in FIG. 12 was taken before beginning the fabrication again this time with a 1 $\mu$m thick hard mask.

Figure 13:
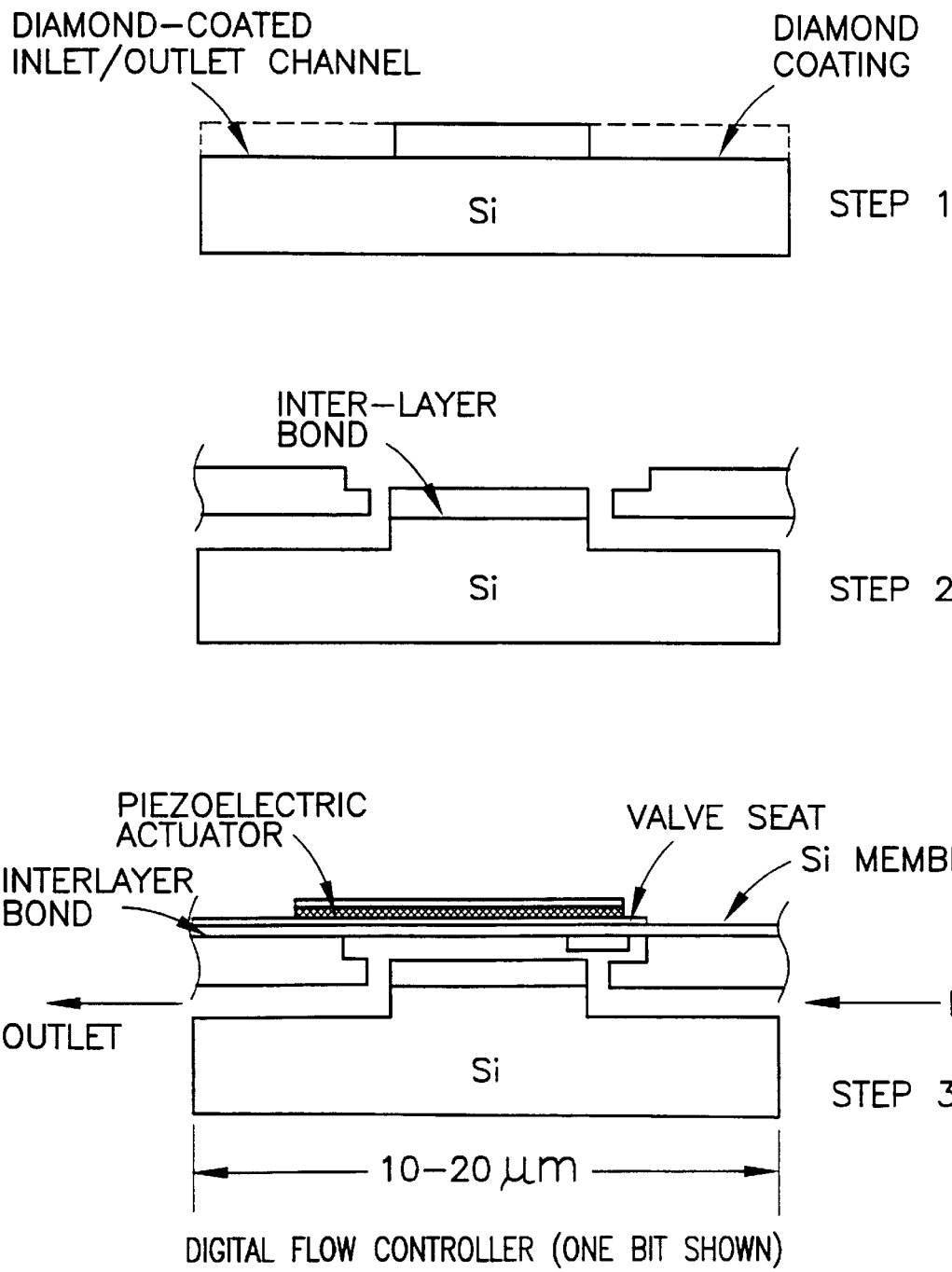
FIG. 13 is a schematic diagram of a digital flow controller made by the method of the present invention.

It is believed that ultrananocrystalline diamond directly deposited on oxide no substrates such as silicon dioxide, aluminum oxide, titanium dioxide, zirconium dioxide, silicate glass and others is due to the carbon dimer reaction with the oxide surface to produce a carbide layer and carbon dioxide gas. The ultrananocrystalline diamond then deposits directly on the carbide layer. The formation of the carbide layer on the oxide surface appears to obviate the need for all surface treatment of the type previously set forth and required in the prior art discussed above. Accordingly, by use of the subject invention, a method has been provided in which structures of ultrananocrystalline diamond films having average grain sizes of less than about 10 nanometers and preferably in the range of about 3–5 nanometers and with feature resolution of less than 1 micron and preferably about 100 nanometers have been provided. Carbon dimer species directly in contact with an oxide substrate apparently form a carbide surface layer on which the ultrananocrystalline diamond nucleates. Thereafter, well known microfabrication processes such as those useful in the semiconductor industry, are employed to provide various shapes and MEMS devices. For instance, FIG. 13 shows schematic representation of a visual flow controller which is a micron scale fluid control valve built with a piezoelectric transducer which presses a silicon button against an orifice as a means for controlling the flow of fluid in the device. The device can be fabricated in three sections if the diamond coating is deposited on the exposed surface of each layer, using well known patterning methods which have previously been described in the art. The fine-grain structure of the ultrananocrystalline diamond coating makes it possible to produce continuous films on the order of 15 nanometers in thickness compared to prior art deposition processes which produce grain sizes typically on the order of 1–10 microns. Using 1–10 micron grain size material, it is impossible to produce structures having feature resolutions less than 1 micron.

The use of the ultrananocrystalline material of the Gruen et al. patents previously referenced provides a non-porous coating which can provide complete protection of a silicon or silicon dioxide substrate on exposure to hydrogen fluoride, if desired. Other diamond coatings having larger crystal sizes dissolve silicon substrates upon emersion in hydrogen fluoride. For this reason alone, the process and structures made by the present invention are significant advantages in the art.

Accordingly, it has been seen that a method of fabricating structures from ultrananocrystalline diamond films having average grain sizes of less than about 10 nanometers and preferably in the range of between about 35 nanometers and feature resolution of less than 1 micron and preferably about 100 nanometers has been disclosed. The ultrananocrystalline film is manufactured using 60 carbon atoms fullerenes or formed in an argon plasma with methane and less than about one percent hydrogen. The method is useful to produce structures wherein the ultrananocrystalline film is directly deposited onto a variety of oxide substrates such as silicon dioxide, aluminum oxide, zirconium dioxide, titanium dioxide and silica glass. The ultrananocrystalline material formed by the Gruen et al. method is phase pure and may be processed by a variety of microfabrication processes such as wet etching, dry etching, photolithography, reactive ion etching, removal of sacrificial layers, liftoff and other procedures useful for manufacturing MEMS structures or other structures as disclosed in the semiconductor art.

The invention also has disclosed a MEMS structure formed, at least in part, from the ultrananocrystalline diamond films previously discussed. The MEMS structures illustrated in the invention have feature resolutions of less than one micron and as small as about 100 nanometers. The MEMS structures have been produced with wall thicknesses in the range of from about 15 to about 300 nanometers to about one micron. The MEMS structures are diamond patterns of 30 nanometer sizes which either are free standing or on a substrate.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of fabricating structures from ultrananocrystalline diamond films having average grain sizes of less than about 10 nm and feature resolution of less than about one micron, comprising contacting carbon dimer species with an oxide substrate forming a carbide layer on the surface onto which ultrananocrystalline diamond having average grain sizes of less than about 10 nm deposits, and thereafter forming a structure of predetermined shape having a feature resolution of less than about one micron by using a microfabrication process.

2. The method of claim 1, wherein the ultrananocrystalline film has average grain sizes of less than about 5 nm.

3. The method of claim 1, wherein the ultrananocrystalline film is formed from $C_{60}$ carbon atoms.

4. The method of claim 1, wherein the ultrananocrystalline film is formed in an argon plasma with $CH_4$ and less than about 1% $H_2$.

5. The method of claim 1, wherein the structure is a MEMS device.

6. The method of claim 1, wherein the structure is free standing.

7. The method of claim 1, wherein the structure is a MMA.

8. The method of claim 1, wherein the oxide substrate is one or more of $SiO_2$, $Al_2O_3$, $ZrO_2$, and $TiO_2$.

9. The method of claim 1, wherein one or more of the features is hollow.

10. The method of claim 1, wherein the ultrananocrystalline diamond is phase pure.

11. The method of claim 1, wherein the microfabrication process includes one or more of wet etching, dry etching, photolithography, reactive ion etching, removal of sacrificial layers and lift off.

12. A microelectromechanical structure formed at least in part from ultrananocrystalline diamond films having average grain sizes of less than about 10 nm and feature resolution of less than about one micron.

13. The microelectromechanical structure of claim 12, wherein the structure has features resolution of about 100 nm.

14. The microelectromechanical structure claim 12, wherein the structure has wall thicknesses between about 300 nm and 1 micron.

15. The microelectromechanical structure claim 12, wherein the structure has wall thicknesses between about 15 nm and 1 micron.

* * * * *